United States Patent [19]
Gelbart

[11] Patent Number: 6,107,011
[45] Date of Patent: Aug. 22, 2000

[54] METHOD OF HIGH RESOLUTION OPTICAL SCANNING UTILIZING PRIMARY AND SECONDARY MASKS

[75] Inventor: Daniel Gelbart, Vancouver, Canada

[73] Assignee: Creo SRL, Burnaby, Canada

[21] Appl. No.: 09/390,582

[22] Filed: Aug. 31, 1999

Related U.S. Application Data

[63] Continuation-in-part of application No. 09/228,078, Jan. 6, 1999.

[51] Int. Cl.[7] ........................................................ G03F 9/00
[52] U.S. Cl. ............................ 430/397; 430/30; 430/942; 430/945
[58] Field of Search .............................. 430/30, 397, 942, 430/945

[56] References Cited

U.S. PATENT DOCUMENTS

| | | | |
|---|---|---|---|
| 5,739,898 | 4/1998 | Ozawa et al. | 355/53 |
| 5,847,812 | 12/1998 | Ooki et al. | 355/67 |
| 5,851,707 | 12/1998 | Shibuya et al. | 430/5 |

OTHER PUBLICATIONS

Ooki et al: "Exeperimental Study on Non–Linear Multiple Exposure Method" SPIE vol. 3051 pp. 85–93, 1997.

*Primary Examiner*—Christopher G. Young
*Attorney, Agent, or Firm*—Oyen Wiggs Green & Mutala

[57] ABSTRACT

A method of high resolution imaging for integrated circuits employs two masks and a laser source to impart an image onto a thermoresist coated image receiving surface. A primary mask carries a principal image to be recorded and a secondary mask contains an array of lenslets. The lenslet array concentrates light from a pulsed laser source onto a plurality of exposure points on the primary mask and the image features contained within that plurality of exposure points are imagewise reproduced in a corresponding plurality of exposure points on the image receiving surface. The lenslets in the lenslet array are dimensioned and positioned such that the plurality of exposure points formed on the image receiving surface have sufficient separation to avoid interaction. Relative motion ("scanning") between the primary and secondary mask creates raster lines on the primary mask to be exposed onto corresponding raster lines on the image receiving surface. Scanning continues until the entire image is transferred to the image receiving surface.

18 Claims, 7 Drawing Sheets

METHOD OF HIGH RESOLUTION OPTICAL SCANNING UTILIZING PRIMARY AND SECONDARY MASKS

RELATED INVENTIONS

The invention herein disclosed is a continuation-in-part of a co-owned, co-pending application No. 09/228,078 (the '078 application) filed on Jan. 6, 1999.

FIELD OF THE INVENTION

The invention relates to the high resolution imaging of an etch resistant layer commonly referred to as a "resist". Once exposed and developed, a resist is typically employed as part of a process used to fabricate integrated circuits and flat panel displays. In particular, the invention relates to a method of imparting a high resolution image onto a resist using the scanning features of new microlithography devices employed in the semiconductor fabrication industry.

BACKGROUND OF THE INVENTION

A principal image can be optically recreated by forming a primary mask containing the principal image and then shining light through the primary mask onto an image receiving surface. Some image features on the primary mask block the light while other image features on the primary mask allow the laser light to be transmitted to the image receiving surface. The transmitted light changes the characteristics of the image receiving surface, recreating the image thereon.

Etch resistant layers known as resists are used widely in the semiconductor industry. Generally, resists may be applied to a wafer and then "exposed" with laser light, so as to impart an image onto the resist. In the image areas where exposure occurs (the "imagewise exposed areas"), the chemical or physical properties of the resist are altered. A chemical process is then applied to the wafer, removing the resist in the imagewise exposed areas (or possibly in the unexposed areas for negative working resists). Removal of the resist uncovers the underlying material, which may now be etched, deposited onto, or made to undergo chemical reactions. For the purposes of this disclosure and the subsequent claims, the word "resist" should not be limited to the traditional use of resists in semiconductor fabrication processes. Rather, "resist" should be interpreted in a broad sense to mean any patterned layer that may be imaged by radiation.

Historically, most resists were "photoresists", which are exposed by the photonic action of light, or "electron beam resists", which are exposed by electron beam radiation. These two types of resists share a common property; they both respond to total exposure, rather than momentary illumination and once the total exposure reaches a threshold level, the resists undergo a chemical or physical change. In optics, "exposure" is defined as the linear integral of illumination over time. For example, a photoresist can be exposed by an illumination of 100 mW/cm$^2$ for a time of 1 second to yield an exposure of 100 mJ/cm$^2$, or equivalently, can be exposed by 1000 mW/cm$^2$ for 0.1 seconds to yield the same total exposure. This phenomenon, known as the "reciprocity law", governs the imaging of photo and electron beam resists, as they are sensitive to the total exposure to radiation.

Ignoring secondary effects, such as the coherence of the light source, photo and electron beam resists behave according to a linear function of power and time; as such, they follow the principle of linear superposition, which implies that $f(a+b)=f(a)+f(b)$. That is, the total exposure response of a photoresist to radiation made up of multiple parts is equal to the sum of the exposure responses to each element of radiation, as if it were applied separately.

Because of the superposition principle and the reciprocity law, photo and electron beam resists require high contrast ratios and low leakage. For example, an imaging system may have stray light leakage of 1% (i.e. when the illumination is "off", the light level does not drop to zero, but only to 1% of the "on" state). In this situation, the total exposure due to stray light may approach the same level as the nominal exposure if the stray light is left "on" for a long period of time. Light leakage may also cause problems for storage and handling of photoresists, because photoresists can be exposed by ambient light.

A more significant disadvantage is caused when trying to image high resolution features onto a photoresist. The point spread function of an optical system causes a "spreading" of light from each image feature. This spreading may produce an overlap between the light which exposes adjacent image features, effectively reducing the system resolution. Obviously a reduction in resolution is an undesirable characteristic, particularly in the semiconductor fabrication industry, where image features are reaching the sub-micron level.

Recently, a new type of resist, known as a thermoresist, has been developed for use in the manufacturing of printing plates and printed circuit boards. Thermoresists change their chemical or physical properties when a certain threshold temperature is reached, rather than a certain accumulated exposure. Thermoresists do not obey the laws of reciprocity or superposition. In contrast to photoresists, which may be exposed by prolonged exposure to ambient light, a thermoresist will not be exposed by prolonged exposure to ambient (i.e. cool) temperature, because it does not obey the reciprocity law. For this reason, thermoresists are more convenient than photoresists, because they do not require expensive handling procedures to prevent accidental exposure.

An additional advantage of thermoresists is that their exposure is a non-linear process (i.e. superposition does not apply), because stray heat dissipates quickly from the surface of the material. This feature of thermoresists can be exploited to improve the system resolution by dividing a principal image into multiple component images and then individually exposing the component images until the entire principal image is recreated. This technique was the subject of the '378 and '078 applications and is discussed below.

The '078 application discusses how improved image resolution can be obtained on an image receiving surface coated with thermoresist by separating the principal image into a plurality of component images. The component images are individually recorded onto the image receiving surface until the entire principal image is recreated. The technique disclosed in the '078 application involves dividing the principal image on the primary mask into an array of cells, wherein the cell size corresponds to the size of the minimum image feature. It is important to understand throughout this disclosure, that the concept of a "cell" is purely for ease of discussion. There is no actual division of the principal image.

A secondary mask is introduced between the laser source and the primary mask. The secondary mask contains an array of optical elements, which causes the illumination of a subset of cells (i.e. a plurality of exposure points) on the primary mask and the imagewise recording of a corresponding plurality of exposure points on the image receiving surface. The optical elements on the secondary mask have a known configuration and orientation, such that the plurality of exposure points illuminated on the primary mask and the corresponding plurality of exposure points imagewise recorded on the image receiving surface are separated from one another by a predetermined interval. The interval between the individual exposure points illuminated on the primary mask and the corresponding individual exposure points imagewise recorded on the image receiving surface is referred to in the '078 application as the "pitch". It should be understood that the term "pitch" is used in association with the exposure points on the primary mask and the image receiving surface, and not the secondary mask. Rather, the secondary mask has a predetermined configuration and orientation of optical elements, which produce the pitch on the primary mask and the image receiving surface.

A conventional optical stepper, can then be used to translate (i.e. "step") the primary and secondary masks with respect to one another so as to record a second component image. Stepping and recording of component images continues until the entire principal image on the primary mask is transferred to the image receiving surface. Obviously, the total number of stepping and recording procedures required to record the entire principal image depends on the pitch.

Figure 1:
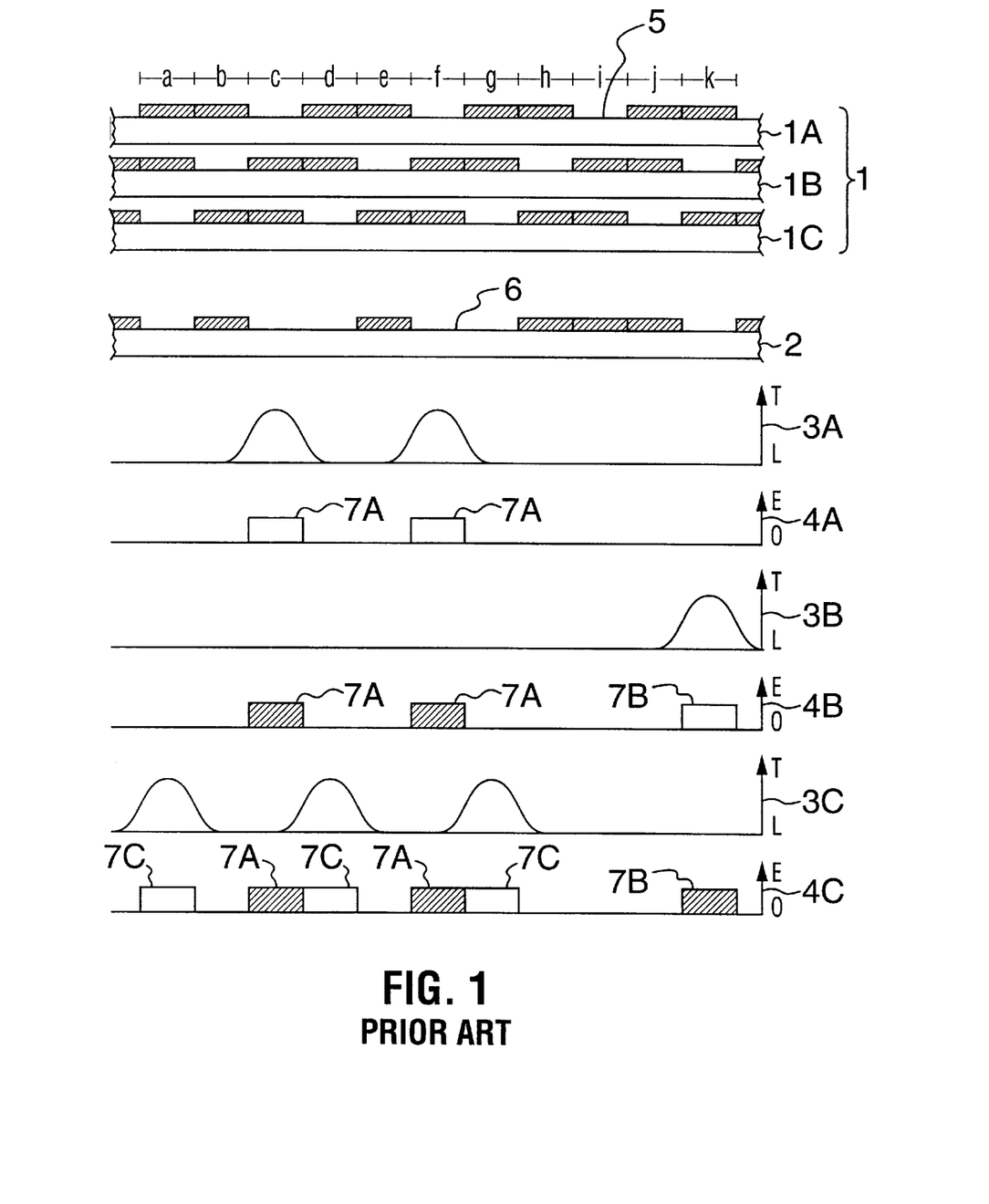
FIG. 1 depicts the prior art process of dividing the principal image on the primary mask into a number of component images.

A one dimensional representation of the process is depicted in FIG. 1. The secondary mask 1, containing a series of evenly spaced apertures 5, is shown in three different locations (1A, 1B, 1C) relative to the primary mask 2, which carries the principal image 6. The primary mask 2 is divided into cells (a, b, c, d, e, f, g, h, I, j, k). One again, it should be understood that the term "cell" is purely for ease of reference and discussion, as there is no actual division of the primary mask 2.

When the laser source (not shown) impinges on the secondary mask 1 in position 1A, a plurality of exposure points (i.e. cells c, f and i) on the primary mask 2 are illuminated. It can be seen that the apertures 5 of the secondary mask 1 are configured, positioned and oriented so as to create a pitch of three on the primary mask. That is, the interval between the illuminated cells (c, f and i) on the primary mask 1 is three. Light from the laser source is imagewise transmitted through the primary mask 2 in a fraction of the cells c and f, but the principal image 6 contained on the primary mask 2 blocks the light completely in cell i. Consequently, the temperature distribution 3A is produced on the image receiving surface. At a certain threshold temperature t, the thermoresist, which coats the image receiving surface, is exposed, undergoing a chemical change. Plot 4A depicts the resultant component image, with an exposure pattern 7A recorded on the image receiving surface. The exposure pattern 7A represents a component image, which is the imagewise exposure of the plurality of exposure points (i.e. cells) on the primary mask 2 that were illuminated when the secondary mask 1 was in position 1A.

An important aspect of the improved resolution characteristics of thermoresists can be seen by noticing that the component image 7A does not show the effects of the stray heat contained in the "tails" of the temperature distribution 3A, which spread laterally outsid e of the cells c and f. Because this stray heat is below the threshold level t and the thermoresist does not obey the reciprocity law, the regions impacted by the stray heat will quickly cool down and act as if they never experienced the heat. The thermal time constant of typical thermoresist layers is in the range of a few microseconds. Once the heat is allowed to dissipate, adjacent image features can be recorded in close proximity to the existing image features without fear of the "overlap" of stray heat. Without overlap of stray heat, a much higher resolution can be obtained than that of photo and electron beam resists, where stray irradiation caused by the spreading of light or electrons can overlap onto adjacent image features (see also the discussion of FIG. 3 below).

After creating the first component image 7A and a short delay (i.e. to allow the stray heat to dissipate from the "tails" of the temperature distribution 3A), secondary mask 1 is stepped to position 1B, such that the apertures are repositioned over primary mask cells b, e, h, and k. The principal image 6 on the primary mask 2 blocks the light in all of the cells except k, and the temperature distribution 3B is created on the image receiving surface. Plot 4B depicts the cumulative resultant exposure pattern, which shows the combination of component image 7A and 7B. Finally, a third component image 7C is created with the secondary mask 1 in position 1C over primary mask cells a, d, g, and j. The resultant heat distribution is depicted in graph 3C and the cumulative resultant component image 7A, 7B, and 7C is depicted in plot 4C.

Plot 4C clearly shows that the principal image 6 carried by primary mask 2 has been recreated on the image receiving surface. It may also be seen from plot 4C that the "tails" of the heat distributions (i.e. 3A, 3B, and 3C) from the various component images (i.e. 7A, 7B, and 7C) do not affect the overall image 4C transferred to the image receiving surface.

Figure 2:
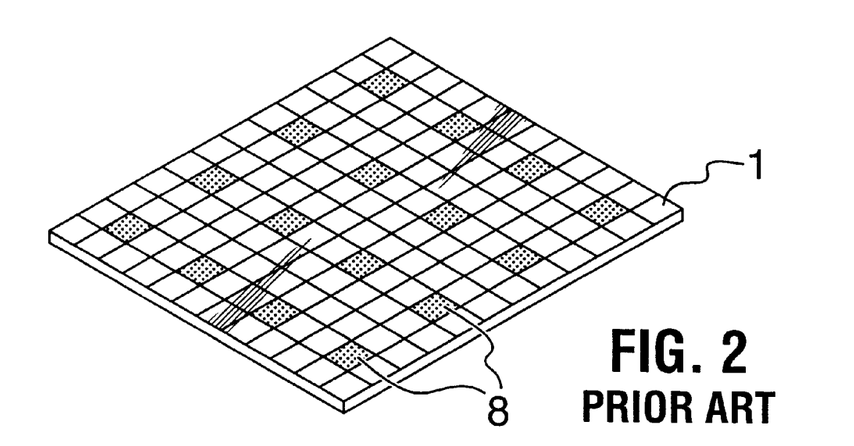
FIG. 2 depicts a prior art secondary mask containing apertures with a pitch of three.

FIG. 2 shows a secondary mask 1 according to the '378 invention, with apertures 8. The apertures 8 of the secondary mask 1 are oriented, configured and positioned so as to create a plurality of exposure points with a pitch of three on the primary mask (not shown).

Figure 3:
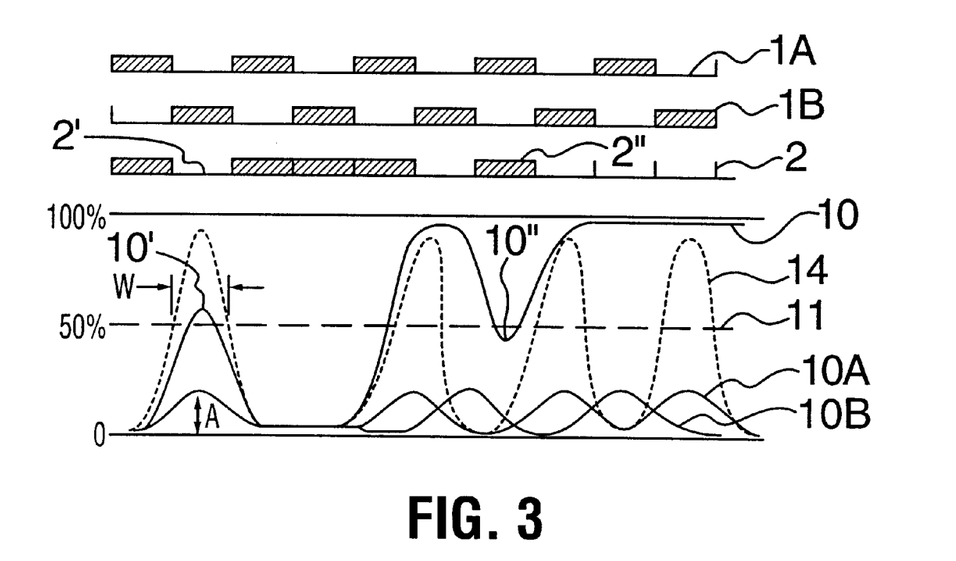
FIG. 3 shows several graphs and plots which depict the advantages gained from separating the exposure points by using component images.

The primary benefit of separating the primary image into component images is an improvement in the available resolution, which is described with reference to FIG. 3. A limiting factor in the resolution of an optical imaging system is the resolution of the optics themselves. In practical imaging systems, an optical system (not shown) is introduced between the primary mask 2 and the image receiving surface (not shown) in order to focus the imagewise illumination of the principal image 6 onto the image receiving surface. In a prior art, single illumination process, the resolution of the optical system had to be extremely fine. In practice, this resolution had to be approximately sufficient to cause the change in light intensity at the image receiving surface from the smallest image feature to exceed 50% of that of the largest image feature.

This "rule of thumb" requirement is depicted by the relationship between graph 10 and threshold 11. Graph 10 represents the system response of a prior art, single illumination process at the image receiving surface. To resolve the smallest individual transparent image feature 2', the corresponding response 10' at the image receiving surface has to exceed the threshold 11. As can be seen from the graph 10, the response 10' at the image receiving surface is insufficient to recreate the image feature 2', which has a width W. If the overall system power density (i.e. laser intensity) was increased, the height of the entire response 10 would increase, and the particular aspect of the response 10' would also increase, so as to faithfully reproduce the width W of the image feature 2'. However, increasing the laser intensity is not always possible, in a single illumination process the smallest individual opaque feature 2", must also be resolved, meaning that the corresponding response 10" can not be caused to rise above the threshold 11. An increase in the overall system power density would cause the aspect 10" of the system response corresponding to opaque feature 2' to rise above the threshold 11, such that the opaque feature 2' would not be resolved. In a single illumination process, any attempt to improve the reproduction of feature 2' will be at the expense of feature 2". For this reason, the threshold 11 was normally selected to be roughly at the midpoint between the exposure level generated by the largest opaque area (i.e. nearly zero) and the exposure level generated by the largest transparent area (shown as 100% in FIG. 3). Thus, the practical rule for single illumination systems was that the resolution of the optics had to be sufficient to cause the change in light intensity at the image receiving surface from the smallest image feature to exceed 50% of that of the largest image feature.

The resolution problem explained above can be completely solved by dividing the principal image into component images. FIG. 3 shows a secondary mask 1 with a pitch of two. Assume that when the secondary mask 1 is in position 1A, that the optical system only has sufficient resolution to produce the response given by plot 10A at the image receiving surface. The response corresponding to feature 2' only has height A (i.e. much less than the required threshold 11). However, the total intensity of the laser source (not shown) can be increased until plot 10A becomes plot 14, crossing the threshold 11 to generate the correct feature size W. The secondary mask 1 can then be moved to position 1B and the plot 10B can be "scaled up" in the same fashion, by increasing the laser intensity.

To exploit the above mentioned benefits of using component images, the interaction between image features 2' and 2" requires that the apertures 5 of the secondary mask 1 are oriented, sized and configures in a particular manner. The size of the exposure points illuminated on the primary mask (i.e. the cells) must be the same size (or smaller) than the smallest image feature and the pitch of the exposure points must be two or greater (i.e. adjacent cells must not be illuminated). If these conditions are met, then adjacent image features on the primary mask 2 are always exposed during different component images. When adjacent image features are imaged during different component images, then the intensity of the laser source can be increased as described above.

In theory, the response level A can be a very small fraction of the threshold level 11. In practice, however, the level A is limited by the interaction between image features. The smaller the response A is, the higher the increase in laser intensity must be in order to reach the threshold 11. Consequently, the exposure points on the primary mask (i.e. cells) must have a greater pitch in order to avoid interaction between the "neighboring" cells of a component image. Because the cell size corresponds to the minimum feature size, a reduction in the response level A corresponds to a lower cell size, a larger pitch and a higher resolution. It is well known that the density of integrated circuits requires the use of the smallest features and highest resolution possible; this corresponds to a small A value, a higher pitch and lower cell size. Consequently, the process of dividing a principal image into multiple component images is well suited to semiconductor processing technology.

Figure 4:
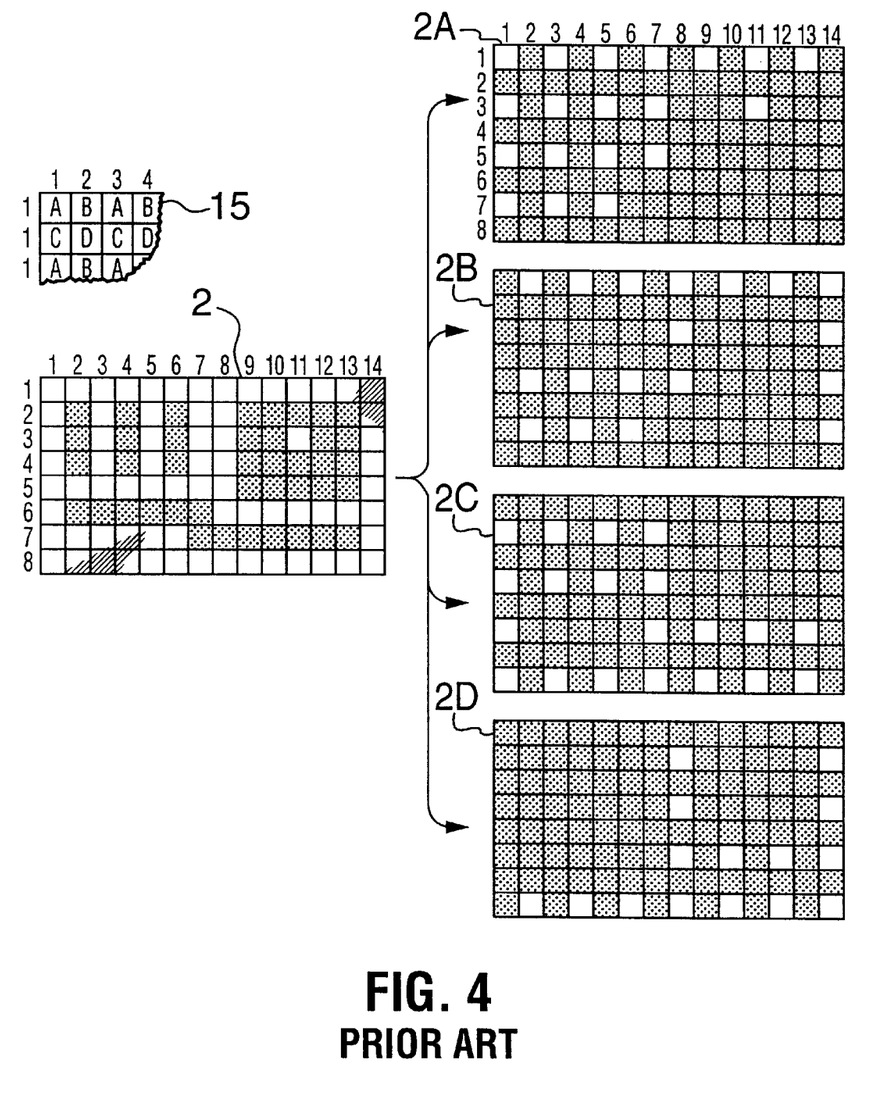
FIG. 4 shows a prior art process wherein a principal image was divided into four component images with a pitch of two.

FIG. 4 depicts the separation of a principal image 2 into four component images (2A, 2B, 2C and 2D). The insert 15 demonstrates how the secondary mask (not shown) would have had to have been configured and oriented so as to produce component images (2A, 2B, 2C and 2D) with a pitch of two. Component image 2A was exposed when the secondary mask was positioned to illuminate cells in odd rows and columns. Similarly, the secondary mask position for component image 2B would allow illumination of cells in odd rows and even columns, 2C would allow illumination of cells in even rows and odd columns and 2D would allow illumination of cells in even rows and columns.

The '078 application discloses that a secondary mask may be composed of a two dimensional array of lenslets rather than a set of evenly spaced apertures. The disadvantage of apertures is that a significant percentage of the light from the laser source is attenuated by the secondary mask and does not contribute to the exposure at the image receiving surface. On the other hand, a lenslet array can be used to concentrate the light energy. Accordingly, a secondary mask comprising a lenslet array can be used to focus the light energy onto the plurality of exposure points of the primary mask in a manner which increases the imaging efficiency and reduces the exposure time. The lenslets in the secondary mask can be dimensioned and positioned so as to illuminate cells on the primary mask with a certain pitch. This may be done by controlling the magnification, dimensions, spacing, orientation and numerical aperture of the lenslets in the secondary mask as well as the spacing between the secondary and primary masks.

The '078 application also discloses a method and apparatus operative to move the secondary mask on two axes, while maintaining precise control over its position and registration. Accurate control of the relative position of the two masks is important to ensure that the various component images are exposed properly, so that they will recombine to form the entire principal image on the image receiving surface.

Figure 5:
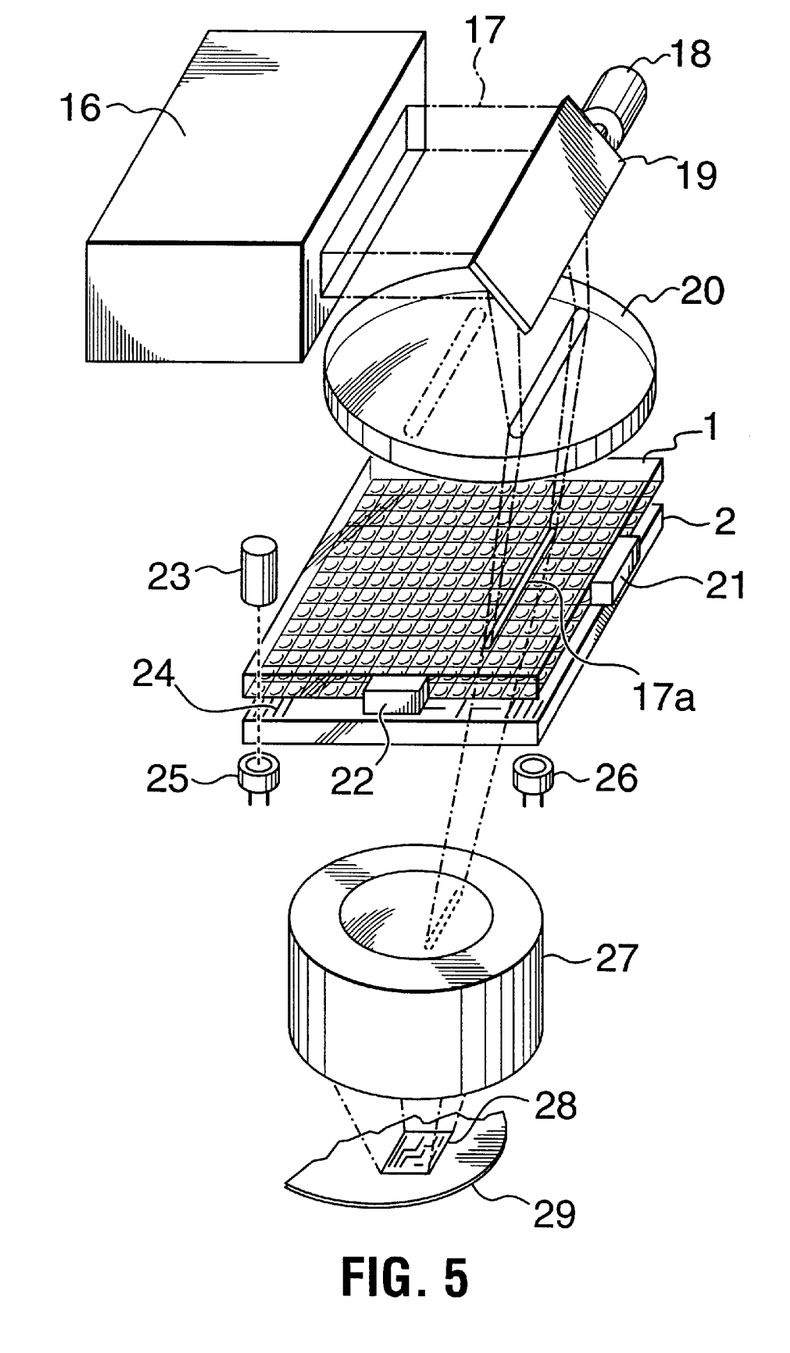
FIG. 5 depicts the '078 invention as configured within an optical stepper microlithography device.
Figure 6:
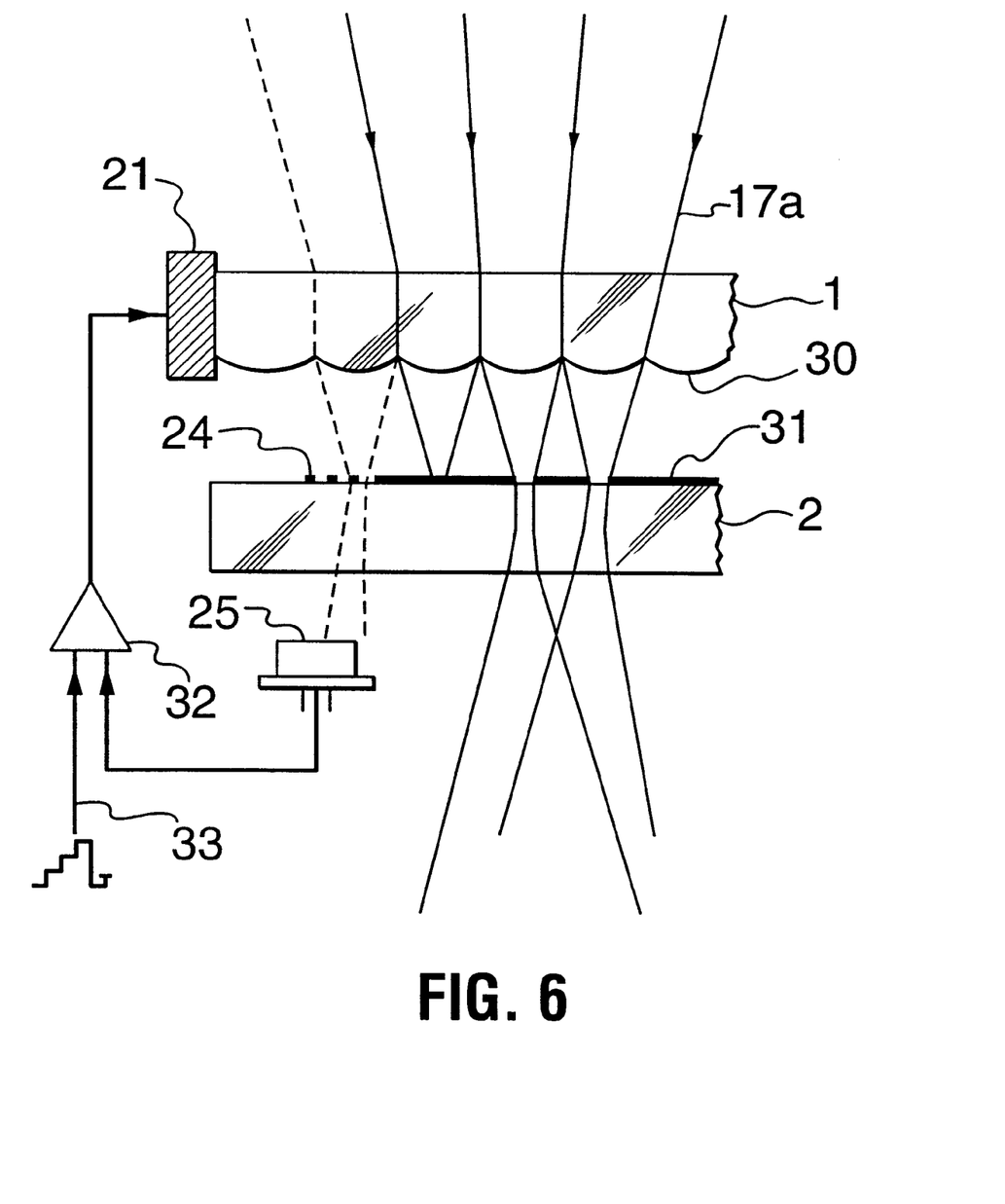
FIG. 6 is a cross sectional depiction of the lenslet array and the elements of the position and registration control system as taught by the '078 application.
Figure 7:
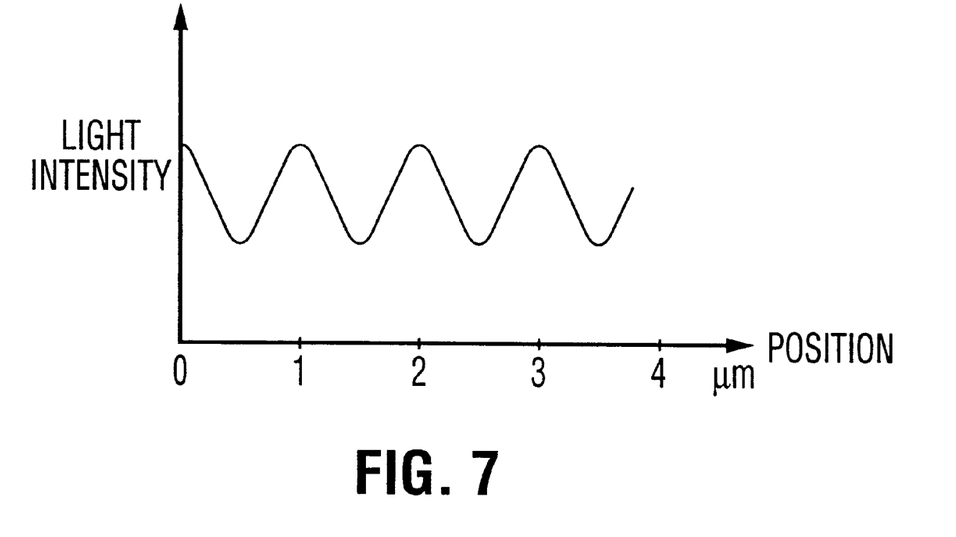
FIG. 7 depicts the light intensity response of the photo-detectors used in the position and registration control system of the '078 invention.

The registration and position control of the '078 application is depicted in FIGS. 5, 6 and 7. FIG. 5 shows the apparatus according to the '078 invention, wherein the position control of the secondary mask 1 is accomplished using a system of piezo-electric actuators 21 and 22, photo-detector 25 and linear grating markings 24 located on the edge of the primary mask 2. As depicted in FIG. 6, light 17a travelling through the lenslets 30 of the secondary mask 1, will be focused down to the size of a single cell when it strikes the grating markings 24 on the primary mask 2. The linear grating markings 24 are created with line and spacing widths equivalent to that of the cells in the imaging process. The response at the photo-detector 25 is reproduced in FIG. 7. When the light is focused squarely onto an opaque grating line, then the resulting light intensity (FIG. 7) at the photo-detector 25 will be at a minimum. Conversely, when the light is focused squarely onto a grating space, the resulting light intensity (FIG. 7) will be at a maximum. In this manner, the photo-detector 25 is able to detect whether the secondary mask is properly registered and comparing amplifier 32 is able to control the piezo-electric actuators 21, 22 so as to move the secondary mask. Once a first peak in the detected signal (FIG. 7) is located (i.e. the light is focussed onto a space on the grating 24), then the secondary mask must only be moved a discrete number of peaks, because the peaks of detected signals correspond to the spacing of the grating, which corresponds in turn with the cell size used in the imaging process.

Figure 8:
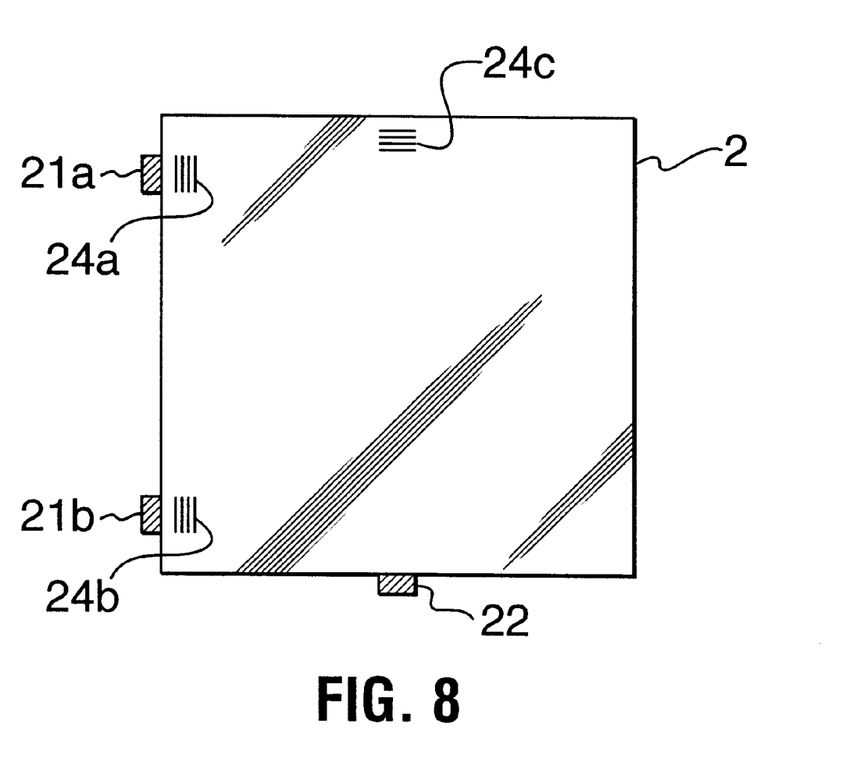
FIG. 8 schematically depicts the position control system of the '078 invention showing a plurality of actuators and registration markings.

FIG. 8 shows a configuration with three sets of position marking 24a, 24b, and 24c and three corresponding actuators 21a, 21b, and 21c. The two sets of position markings 24a and 24b coupled with two sets of actuators 21a and 21b can be used to control the motion of the secondary mask in one dimension and any potential rotation of the secondary mask. A single set of markings 24c and a single actuator 22 along the transverse axis are used to control the motion of the secondary mask along the transverse axis.

The '078 application also discloses an additional technique that can be used to further concentrate the intensity of the light in the system. The method is depicted in FIG. 5 and involves creating a concentrated line of laser light 17a using mirror 19 and lens 20. Actuator 18 may then be used to "scan" the line 17a across the surface of the secondary mask 1. According to this process, the formation of a single component image would require that the line of light 17a be completely scanned across the width of secondary mask 1. At the expense of slightly more time for each component image, this technique would greatly increase the power density of the light received at the image receiving surface 28. If the laser is a pulsed laser, then the line width and the scan rate of the line 17a are constrained by the fact that at least one pulse must be delivered to each cell of a component image. This technique of using a concentrated scanning line 17a is particularly well suited for optical steppers of the "step and scan" variety, as many of the scanning optics are already provided.

The '078 application discussed the technique of using primary and secondary masks in conjunction with the conventional technology for microlithography known as "optical steppers". In a typical semiconductor fabrication application, the image receiving surface is a wafer and each wafer has several die, which may be cut from the wafer to form chips. Optical stepper devices employ discrete movements (i.e. "stepping") between the various die on the wafer in order to impart an image on to each die. A second type of technology, widely used in the printing industry and recently entering into microlithography involves "scanning". Scanning microlithography devices continuously (rather than discretely) move the wafer with respect to the masks to recreate the image on each die. As such, a method is required to import the technique of using primary and secondary masks described in the '078 application into the presently available scanning semiconductor fabrication devices.

Microlenses were used in prior art to improve the quality of the illumination system in semiconductor equipment and for resolution enhancement. For example, the paper "New Method to Improve the Practical Resolution of Complex Pattern in Sub-Half Micron Lithography" by Xunan et al (SPIE vol. 3334, 1998) discloses improved illumination by using microlenses. This paper, however, does not use the idea of separating the image into subsets, or the use of non-integrating resists which are used in the present invention. Separating the image into subsets is disclosed by U.S. Pat. No. 5,739,898 however it requires a large number of masks in order to separate the image. Also, while the '898 patent uses a non-linear resist it is not free from light integration effects. Non-linear resists are also mentioned in U.S. Pat. No. 5,847,812 and in the paper "Experimental Study on Non-Linear Multiple Exposure Method" by Oki et al (SPIE vol. 3051, pp. 85–93, 1997). These and other non linear resists follow the relationship $E=\int I^n dt$, wherein E=exposure; I=light intensity; n=exponent typically from 1 to 2; and t=time. Resists for which n=2 are also known as "two photon resists" and respond to the square of the illumination. While non-linear resists do not follow the law of reciprocity they are not free from reciprocity and light integration effects, as a prolonged exposure to a low intensity will expose the material; exposure speed will increase faster than the increase in light intensity. This is the basis of U.S. Pat. No. 5,847,232. U.S. Pat. No. 5,851,707 uses image separation but is a linear resist and offers very little improvement.

None of the prior art has the key elements of the present invention, namely using a secondary mask made of microlenses in order to achieve image separation without multiple masks and in particular using this image separation in conjunction with a resist which is completely outside the domain of linear superposition, such as a thermoresist.

Semiconductors are manufactured today using mainly two types of exposure devices, known as steppers and scanners. In a stepper both the mask and wafer are stationary during exposure. In a scanner both the mask and wafer are moving ("scanned") during exposure. The implementation of the invention can be simpler for scanners, as the relative motion between the microlens and mask is provided by the scanning. Since both steppers and scanners are widely used and well known to those skilled in the art, no further details about their construction and operation are given. Both types are manufactured by companies such as ASML (Holland), Canon (Japan) and Nikon (Japan).

It is an object of the present invention to reduce the effects of optical "spreading" and the overlap of adjacent image features and to increase system resolution by providing a method wherein a secondary mask may be used to retain separation between exposure points on the primary mask and the image receiving surface.

It is a second object of the present invention to incorporate the technique of using primary and secondary masks into presently available scanning microlithography devices, so as to recreate a high resolution principal image on an image receiving surface.

SUMMARY OF THE INVENTION

In accordance with the present invention, a method of using a laser source to transfer a principal image onto an image receiving surface is disclosed. The method involves inserting a secondary mask between the laser source and a primary mask, which carries the principal image. The secondary mask contains an array of optical elements, which performs the steps of:

(i) directing light on to a plurality of exposure points on the primary mask; and (ii) imagewise illuminating and exposing a corresponding plurality of exposure points on the image receiving surface.

The plurality of exposure points on the primary mask and the and the corresponding plurality of exposure points on the image receiving surface are sufficiently separated to substantially avoid any interaction between adjacent exposure points.

The next step involves exposing substantially all of the principal image on the image receiving surface by creating relative motion between the primary mask and the secondary mask. In this manner, the plurality of exposure points is scanned over substantially all of the principal image carried on the primary mask.

The relative motion may be created in several ways including: moving the secondary mask in one dimension or two dimensions or moving the primary mask in one dimension or two dimensions.

Advantageously, the optical elements on the secondary mask may be arranged in a two dimensional array. In the two dimensional array, there may be a plurality of columns of optical elements and a plurality of rows of optical elements. Each of the rows may be offset, in a direction of the rows, relative to an adjacent row, such that the columns are oriented at a non-perpendicular angle with respect to the rows.

Advantageously, the optical elements on the secondary mask may be apertures, gratings, lenses, mirrors or light valves and the image receiving surface may be coated with a thermoresist, a photoresist or an electron beam resist.

Preferably, the directing step (i) may further comprise a step of concentrating light from the laser source on to the plurality of exposure points on the primary mask.

Advantageously, the laser source may be pulsed.

The exposing step may also be further divided into a several steps which comprise:

(a) inserting an optical system between the laser source and the secondary mask, so as to concentrate the power density of the light from the laser source into an area on the secondary mask; and (b) controlling the optical system in a manner such that the area is scanned at a rate substantially equal to that of the relative motion between the primary mask and the secondary mask, such that the area of concentrated light remains substantially motionless on the secondary mask during the exposing step (b).

DESCRIPTION OF THE PREFERRED EMBODIMENT

The preferred embodiment of the invention for use in steppers is depicted in FIGS. 5 and 6. Referring now to FIGS. 5 and 6, the invention uses a two dimensional array of lenslets 30 as the secondary mask 2. Instead of attenuating the power density of light (in a manner similar to the prior art secondary mask 1 of FIG. 2), the lenslet array mask 1 of the invention actually concentrates light energy onto a subset of cells on the primary mask 2. As can be seen from FIG. 5, when the secondary mask 2 is in a given position, the light 17a which is collected by the lenslets 30 of the secondary mask 1, is focused on a particular subset of cells on the primary mask 2. Typically, the lenslets 30 are shaped and the position of the secondary mask 2 is configured such that the subset of cells illuminated represents a certain pitch on the primary mask 2. Primary mask 2 carries the principal image 31. When light 17a travels through the subset of cells on the primary mask 2, it goes on to form an image subset (not shown) on the semiconductor wafer 10. The separation between lenslets 30 and image 31 is determined by the focal length of the lenslets 30, which in turn is determined by the required numerical aperture of lens 27.

If the light impinging on the secondary mask 1 is not collimated, then the pitch of lenslets 30 must increase as the lenslets 30 are located further from the primary mask 2 so as to maintain the proper pitch on the primary mask 2. By controlling the magnification, dimensions and numerical aperture of the lenslets 30 and the distance between the two masks (1 and 2) the location of the light striking the primary mask 2 (i.e. the subset of cells) can be controlled precisely. Obviously, the collection of light is not limited to the use of lenses, and any method of concentrating light, such as diffractive or reflective optics, may be used in the secondary mask 1.

After an image subset is formed, then the secondary mask 1 is moved so as to form another image subset by imaging a different subset of cells on primary mask 2. The movement of the secondary mask is performed by a plurality of piezo-electric actuators 21 and 22. Electrical signals from amplifier 32 are used to control the piezo-electric actuators 21. Piezo-electric actuators are commercially available from Lambda Physique (Germany)and many other suppliers.

Referring to FIGS. 5 and 6, the registration and position control of the secondary mask 1 is accomplished using a system comprising the piezo-electric actuators 21,22 photo-detector 25, amplifier 32 and, preferably, linear grating markings 24 located at the edges of the primary mask 2. The registration and position control system may also include an optional secondary light source 23. The key to the registration and position control system is the linear grating 24 which has a line width and spacing width equal to the cell dimensions on the primary mask 2. When light travels through secondary mask 1, it will be focused down to the size of a single cell when it strikes the grating 24 on the primary mask 2. The signal received at photo-detector 25 is depicted in FIG. 7. then the cell sized spots of light are focused onto an opaque line, then the resulting light intensity (FIG. 7) at the photo-detector 25 will be at a minimum. Conversely, when the cell sized spots of light is on a space, then the resulting light intensity (FIG. 7) at the photo-detector 25 will be a maximum. In this manner, the photo-detector 25 is able to detect whether the secondary mask 1 is properly registered. The photo-detector 25 output is fed to comparing amplifier 32 which controls the piezo-electric actuators 21. Once a first peak is located, then the secondary mask is registered and need only be moved in discrete steps corresponding to the dimensions of a single cell. For example, to expose the next image subset, control signal 33 commands actuator 21 to move mask 1 to the next signal maximum of detector 25.

Because the secondary mask 1 must be moved on two axes, control is slightly more complicated than described above. FIG. 8 represents the preferred embodiment. The need to control rotation makes is desirable to have at least two actuators, (21a and 21b), two sensors (not shown), and two sets of position markings (24a and 24b) for at least one axis. This system enables registration and position control on both axes at several locations on the secondary mask and can control rotation of the mask during movement. While FIG. 5 and FIG. 6 show detector 25 measuring the transmitted light it is understood that any other position detection such as reflected or non-optical position sensor can be used.

FIG. 5 depicts an implementation of the apparatus within an optical stepper. Secondary mask 1 is positioned over primary mask 2. Piezo-electric actuators 21 and 22 are positioned on each axis of the secondary mask (note: only one is shown on each axis for simplicity) The registration and position control system is also represented in FIG. 5 by photo-detectors 25 and 26 located under position markings 24 and an optional secondary light source 23. Also shown in this diagram is the imaging lens 27 which images the light emerging from the primary mask 2 onto die 28 of wafer 29 which is coated with thermoresist (not shown).

FIG. 5 also shows an additional technique that can be used to further concentrate the intensity of light in the system. Laser 16 is typically a pulse excimer laser, such as one made by Cymer Inc. (Ca., USA) operating at wavelengths of 248 nm or 193 nm and pulsing at 2 kHz with a pulse energy of 10 mJ/pulse. The additional technique involves optically scanning the laser by mirror 19 mounted on actuator 18 and concentrating the laser light 17, using optical elements 20 so that the light 17a incident on the secondary mask 1 forms a line of width 0.1–1 mm. The line of light 17a may then be scanned across the surface of secondary mask 6. In the preferred embodiment actuator 18 is a galvonometer and element 20 is a lens. According to this process, a single image subset(not shown) formed from a subset of cells on the primary mask 2 would require that the line of light 17a be completely scanned across the width of secondary mask 2 (i.e. a complete scan of the secondary mask 2, by the line of light 17a, would be required for each image subset). At the expense of slightly more time for each image subset, this technique would greatly increase the power density of the light received at the thermoresist (not shown) on the surface of the die 9.

The scan rate of the line is constrained by the width of the line and the laser pulse rate. At least one pulse must be delivered to each cell of mask 2. For example, for a line of width 1 mm, and a 1 kHz pulse rate, the scan rate must be less than 1 mm/ms. All of these parameters can be adjusted easily for optimum performance. This technique is not constrained to "line shapes". Any manner or shape in which the light is concentrated before striking the secondary mask 1 and then scanned across its surface should be considered a part of this invention. The newer generation of steppers, known as "step and scan" devices are particularly suitable for this invention as many parts of the scanning optics are already provided, and the illumination of the mask is already in the form of a line.

Figure 9:
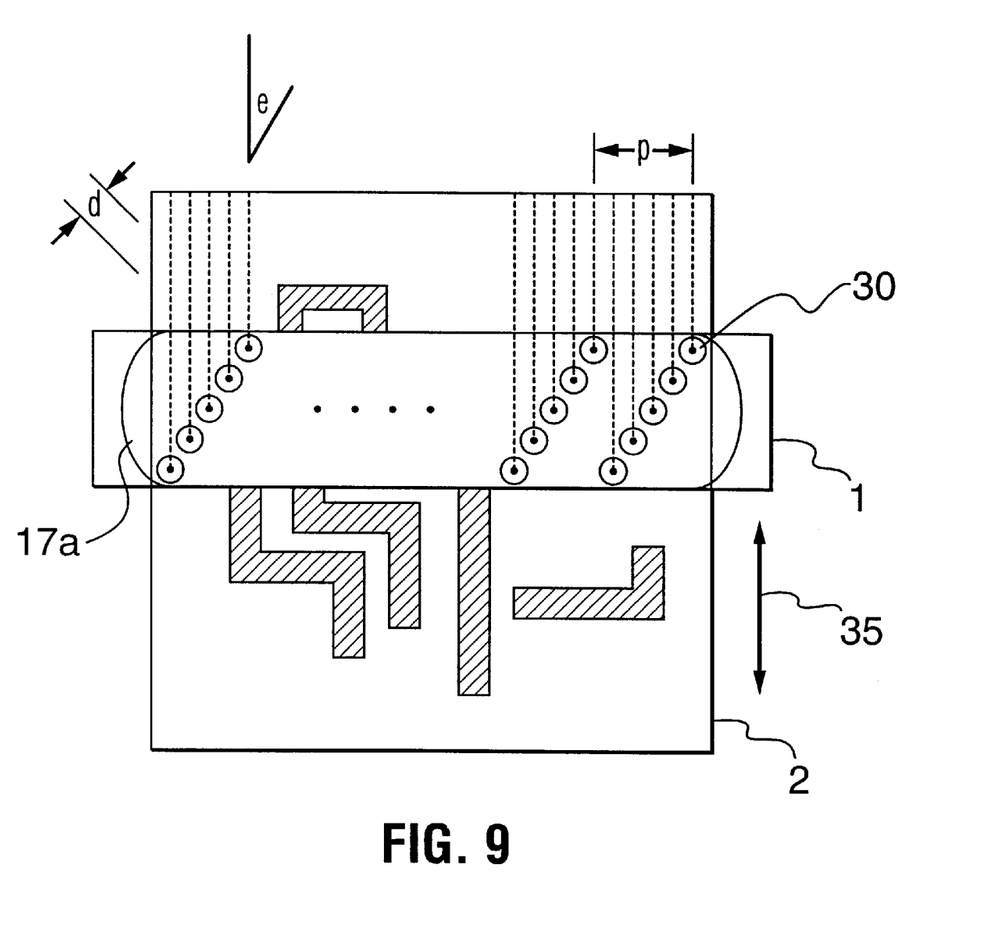
FIG. 9 displays the method of separation of exposure points for use in scanning microlithography devices, that is the subject matter of the present invention.

The prior art methods of dividing a principal image into component images disclosed in the co-owned '078 and '378 applications involve discrete component images formed by moving the secondary mask in discrete increments proportional to one cell on the primary mask. There are some advantages to be gained from moving the secondary mask continuously as opposed to discretely. Combining a continuously moving secondary mask with a rapidly pulsing laser can eliminate the "ripple" effect caused by discrete imaging and create smoother images on the image receiving thermoresist. Obviously, the pulse rate of the laser, the movement rate of the secondary mask and the size of the lenslets in the secondary mask are not all independent of one The secondary mask 1 is comprised of a two dimensional array of lenslets 30, the rows of which are perpendicular to the scan axis 35, and the columns of which are oriented at an angle θ with respect to the scan axis 35. When the secondary mask 1 is exposed to radiation from the laser source a plurality of exposure points are illuminated on the primary mask 2 and a corresponding plurality of exposure points is imagewise illuminated on the image receiving surface (not shown).

The individual lenslets 30 are shaped, oriented and positioned within the array on the secondary mask 1, such that the exposure points on the primary mask 2, which are illuminated by lenslets 30 of adjacent columns are separated by a distance p and the exposure points illuminated by lenslets 30 within a column, are separated by a distance d. The distances p and d correspond roughly to the concept of "pitch" taught by the '078 and '378 applications, because these distances represent the center to center separation between adjacent exposure points. Taking full advantage of the present invention requires that the distances p and d are sufficiently large to substantially eliminate the overlap or interaction between the adjacent exposure points at the image receiving surface. Provided that the distances p and d are sufficiently large, the power of the laser source can be increased, so as to overcome low optical resolution in the resolving optics (not shown) between the primary mask 2 and the image receiving surface. The functionality of this separation technique is depicted in FIG. 3 and explained above.

The angular orientation θ of the columns of lenslets 30, in combination with the scanning of the primary mask 2 with respect to the secondary mask 1 allows the effective spacing of the raster lines a to be less than the spacing p or d of the individual exposure points. This orientation of lenslets 30 also improves the resolution of the system, because the actual raster line spacing is given by $$a = d \sin\theta \tag{1}$$

Simultaneously, however, the separation (p and d) between adjacent exposure points is maintained sufficiently far apart to substantially eliminate interaction.

To further improve the performance of the technique, the laser source may be focused prior to impinging on the secondary mask 1, so as to form a line 17a of extremely high intensity light. The width of the line 17a should be sufficient to cover the number n of lenslets 30 in a given column of the secondary another, since a properly constructed image requires at least one pulse per cell on the primary mask.

EMBODIMENT FOR SCANNERS

Referring to FIG. 9, a top view of an embodiment of the present invention for the use in "scanners" is depicted. The primary mask 2 is continuously moved (i.e. scanned) under the secondary mask along a direction parallel to scan axis 35. Light from the laser source (not shown) is used to illuminate the secondary mask 1, creating a plurality of exposure points on the primary mask 1 and imagewise exposing a corresponding plurality of exposure points on the image receiving surface (not shown). However, as the primary mask 2 is continuously scanned relative to the secondary mask 1, the plurality of exposure points on the primary mask 2 becomes a line referred to as a "raster line" or a "track". To complete the exposure of the principal image on the image receiving surface, the primary mask 2 is scanned relative to the secondary mask 1 until substantially all of the primary mask 2 has been exposed. This scanning motion is an integral part of scanners, the only addition required by the invention is secondary mask 1. mask 1. If this technique is used, then the spacing between raster lines a is constrained by the spacing of exposure points of adjacent columns p and the number of lenslets n in a column. The raster line spacing a, is given by $$a = p/n \tag{2}$$

Equations (1) and (2) may be used in combination to select the appropriate variables n, p, and d to achieve a desired raster line spacing a and to have the width of the line 17a be sufficiently small to have the maximum available light intensity.

The invention may also be improved by using an excimer laser pulsed at a predetermined rate as the light source. When a continuous wave laser is employed, there is no separation between the exposure points on a given raster line. That is, when the primary mask 2 is scanned relative to the secondary mask 1, the exposure points on a given raster line are immediately adjacent to each other. Depending on the thermal time constant of the thermoresist and the scan rate, the exposure of immediately adjacent points may create interaction or overlap on the image receiving surface between adjacent image features within a raster line. An excimer laser with a pulse rate of 1–10 kHz may be used to cause a slight delay between successive exposures. Typically, the time constant of a thermoresist is below a microsecond, which provides sufficient time for adjacent exposure points within the same raster line to cool down so as to avoid overlap of adjacent image features up to a pulse rate of about 1 MHz. With this implementation, the system scan rate and the pulse rate of the laser source are constrained by minimum image feature size (i.e. the required resolution). In order to completely recreate the principal image on the image receiving surface with the desired resolution, at least one pulse is required to be delivered every time that the secondary mask 1 is scanned a distance equal to the minimum feature size.

It should be understood that the above description is intended for illustrative purposes only, and is not intended to limit the scope of the present invention in any way. Those skilled in the art will appreciate that various modifications can be made to the embodiments discussed above without departing from the spirit of the present invention.

While the main benefit of the invention is realized when it is used with non-linear resists and in particular thermoresists, the invention has significant benefits even when conventional photoresists and other materials obeying the "law of reciprocity" are used. These benefits come from the fact that the image separation performed by the invention is equivalent to multiple exposures. Multiple exposures reduce the coherence of the light, which increases resolution. For this reason the resolution of any imaging system using a coherent source such as a laser will be improved by the current invention, as the theoretical resolution of a non-coherent source is twice that of a fully coherent source.

The term "light" in this invention should be understood to mean any source of radiation, whether visible or not, as well as electron beams.

What is claimed is:

1. A method of using a light source to transfer a principal image, carried on a primary mask, onto an image receiving surface, which comprises the steps of:
   (a) inserting a secondary mask between said source and said primary mask, said secondary mask comprising optical elements which perform the steps of:
      (i) directing light on to a plurality of exposure points on said primary mask, said plurality of points being separated by a pre-determined distance; and
      (ii) imagewise illuminating and exposing a corresponding plurality of exposure points on said image receiving surface, said corresponding plurality of exposure points being sufficiently separated to reduce interaction between adjacent exposure points on said image receiving surface; and
   (b) exposing substantially all of said principal image on said image receiving surface by creating relative motion between said primary mask and said secondary mask, such that said plurality of exposure points is scanned over substantially all of said principal image carried on said primary mask.

2. A method according to claim 1, wherein said relative motion is created by moving said primary mask in either one of: two dimensions and one dimension.

3. A method according to claim 1, wherein said relative motion is created by moving said secondary mask in either one of: two dimensions and one dimension.

4. A method according to claim 2, wherein said optical elements on said secondary mask are arranged in a two dimensional array, with said array comprising:
   (a) a plurality of columns, each column having therein a plurality of said optical elements; and
   (b) a plurality of rows, each row having therein a plurality of said optical elements,
   each one of the rows being offset, in a direction of the rows, relative to an adjacent row, such that said columns are oriented at a non-perpendicular angle with respect to said rows.

5. A method according to claim 3, wherein said optical elements on said secondary mask are arranged in a two dimensional array, with said array comprising:
   (a) a plurality of columns, each column having therein a plurality of said optical elements; and
   (b) a plurality of rows, each row having therein a plurality of said optical elements,
   each one of the rows being offset, in a direction of the rows, relative to an adjacent row, such that said columns are oriented at a non-perpendicular angle with respect to said rows.

6. A method according to claim 4, wherein said optical elements on said secondary mask are one of: apertures, gratings, lenses, mirrors and light valves.

7. A method according to claim 5, wherein said optical elements on said secondary mask are one of: apertures, gratings, lenses, mirrors and light valves.

8. A method according to claim 1, wherein said directing step (i) further comprises concentrating light from said light source on to said plurality of exposure points on said primary mask.

9. A method according to claim 1, wherein said light source is a pulsed laser.

10. A method according to claim 1, wherein said image receiving surface is coated with one of: a thermoresist, a photoresist and an electron beam resist.

11. A method according to claim 1, wherein said exposing step (b) further comprises inserting an optical system between said light source and said secondary mask, so as to concentrate a majority of the light from said laser source into a area on said secondary mask in such a manner that the power density of light is increased in said area.

12. A method of using a laser source to transfer a principal image, carried on a primary mask, onto an image receiving surface, which comprises the steps of:
   (a) inserting a secondary mask between said laser source and said primary mask, said secondary mask comprising optical elements, which are arranged in a two dimensional array, with said array comprising:
      (i) a plurality of columns, each column having therein a plurality of said optical elements; and
      (ii) a plurality of rows, each row having therein a plurality of said optical elements,
      each one of the rows being offset, in a direction of the rows, relative to an adjacent row, such that said columns are oriented at a non-perpendicular angle with respect to said rows, said optical elements operative to perform the steps of:
(i) directing light on to a plurality of exposure points on said primary mask, said plurality of points being separated by a pre-determined distance; and
(ii) imagewise illuminating and exposing a corresponding plurality of exposure points on said image receiving surface, said corresponding plurality of exposure points being separated to reduce interaction between adjacent exposure points on said image receiving surface; and (b) exposing substantially all of said principal image on said image receiving surface by creating relative motion between said primary mask and said secondary mask, such that said plurality of exposure points is scanned over substantially all of said principal image carried on said primary mask.

13. A method according to claim 12, wherein said relative motion is created by moving said secondary mask in either one of: two dimensions and one dimension.

14. A method according to claim 12, wherein said relative motion is created by moving said primary mask in either one of: two dimensions and one dimension.

15. A method according to claim 12, wherein said optical elements on said secondary mask are one of: apertures, gratings, lenses, mirrors and light valves.

16. A method according to claim 12, wherein said laser source is pulsed at a predetermined frequency.

17. A method according to claim 12, wherein said image receiving surface is coated with one of: a thermoresist, a photoresist and an electron beam resist.

18. A method according to claim 1, wherein said exposing step (b) further comprises inserting an optical system between said light source and said secondary mask, so as to concentrate a majority of the light from said light source into a area on said secondary mask in such a manner that the power density of light is increased in said area.

* * * * *